United States Patent [19]
Mattes et al.

[11] Patent Number: 6,133,741
[45] Date of Patent: Oct. 17, 2000

[54] METHOD FOR MEASURING RESISTANCE OF LOAD CONNECTED TO A ROTATION TRANSFORMER

[75] Inventors: Bernhard Mattes, Sachsenheim; Hartmut Schumacher, Freiberg; Ralf Henne, Bietigheim-Bissingen, all of Germany

[73] Assignee: Robert Bosch GmbH, Stuttgart, Germany

[21] Appl. No.: 09/171,155

[22] PCT Filed: Sep. 12, 1997

[86] PCT No.: PCT/DE97/02041

§ 371 Date: Oct. 13, 1998

§ 102(e) Date: Oct. 13, 1998

[87] PCT Pub. No.: WO98/36285

PCT Pub. Date: Aug. 20, 1998

[30] Foreign Application Priority Data

Feb. 13, 1997 [DE] Germany ............ 197 05 430

[51] Int. Cl.[7] .................................................. G01R 27/26
[52] U.S. Cl. ................ 324/502; 324/509; 324/547; 324/705
[58] Field of Search ........................... 324/502, 509, 324/519, 525, 547, 768, 769, 705, 710, 711, 793, 726

[56] References Cited

U.S. PATENT DOCUMENTS

| 4,810,950 | 3/1989 | Young ........................... 324/708 |
| 5,278,512 | 1/1994 | Goldstein ...................... 324/509 |

FOREIGN PATENT DOCUMENTS

| 0 337 171 | 10/1989 | European Pat. Off. . |
| 33 34 240 | 4/1985 | Germany . |
| 44 32 301 | 3/1996 | Germany . |

*Primary Examiner*—Safet Metjahic
*Assistant Examiner*—Vincent Q. Nguyen
*Attorney, Agent, or Firm*—Kenyon & Kenyon

[57] ABSTRACT

A method for measuring the resistance of a load, preferably the firing pellet of an airbag, that is connected on the secondary side of a rotary transformer, in which the resistance measurement is largely unaffected by the magnetic coupling between the windings of the transformer. According to this method, the capacitor is partially discharged twice in succession. During the first partial discharge, the capacitor is discharged continuously, and during the second partial discharge, the capacitor is discharged in steps. After the two partial discharges, the residual charge voltages at the capacitor are measured and the difference between the two charge voltages is obtained. This difference is an indication of the resistance of the load connected on the secondary side of the transformer.

6 Claims, 3 Drawing Sheets

METHOD FOR MEASURING RESISTANCE OF LOAD CONNECTED TO A ROTATION TRANSFORMER

BACKGROUND INFORMATION

The present invention relates to a method for measuring the resistance of a load—preferably the firing pellet of an airbag—connected on the secondary side of a rotary transformer, by analyzing an electrical variable that can be sensed on the primary side of the transformer.

An arrangement is known from German Published Patent Application No. 38 12 633 A1 in which a rotary transformer is used, for example, for signal transmission between a control unit and an airbag built into a steering wheel of a vehicle. In order to continuously check the operability of an airbag so that it is immediately ready to operate in any emergency situation, the resistance of the firing pellet, which should lie in the range of, for example, 1.8Ω to 2.5Ω, is subjected to a continuously repeating measurement. Transmission of signals by means of the inductively coupled windings of the rotary transformer depends on the spacing between the two windings, i.e. the size of the air gap between the dished cores of the windings. Installation and production tolerances of the steering wheel on which the secondary-side dished core of the rotary transformer is installed can lead to falsification of the measured resistance of the firing pellet. To prevent such measured-signal falsifications, the aforesaid existing art provides for an oscillator circuit on the secondary side of the rotary transformer that is excited from the primary side by a control signal. After the control signal is shut off, the decaying response signal of the oscillator circuit is transmitted back to the primary side, and the secondary-side resistance is determined from the time constant of the decaying response signal. With this measurement method, the resistance measured on the secondary side depends greatly on the radial and axial clearance between the primary and secondary windings of the rotary transformer. The accuracy with which the firing pellet resistance is measured is therefore not very high.

SUMMARY OF THE INVENTION

It is therefore an object of the present invention to provide a method according to which a load connected on the secondary side of a rotary transformer can be measured with the highest possible accuracy.

The aforesaid object is achieved, in that initially, a capacitor inserted into the primary circuit of the transformer is charged. In a first discharge operation, the capacitor is partially discharged for a predefined time period through the transformer, and then the residual charge voltage of the capacitor is determined. The capacitor is then charged again and subsequently, in a second discharge operation, partially discharged through the transformer with a pulse train, in steps. The residual charge voltage of the capacitor is then determined again. Lastly, the difference between the two residual charge voltages after the first and the second discharge operations is obtained; this provides an indication of the resistance of the firing pellet. Obtaining the difference between the two residual charge voltages mutually compensates for temperature influences and for influences of the radial and axial clearance between the two windings of the rotary transformer, so that the voltage difference depends, to the greatest extent possible, only on the actual resistance of the firing pellet.

The pulse train frequency at which the capacitor is discharged corresponds approximately to the resonant frequency of the resonant circuit which is made up substantially of the inductivity of the transformer and the capacitance of the capacitor.

The voltage occurring at the capacitor after it has been completely charged can be compared to a setpoint; a deviation between the measured voltage and the setpoint indicates a short-circuit at the primary-side terminals of the transformer, or an insulation fault in the capacitor.

A measured value for the capacitance of the capacitor can be derived from a charge voltage reached after a predefined capacitor charging time.

In an arrangement for carrying out the method according to the present invention, the terminals of the primary winding of the transformer, wired to a capacitor, can be switched via electronic switches to a charging circuit or to a discharging circuit. Both the charging circuit and in the discharging circuit, a voltage proportional to the voltage present at the capacitor can be picked off via a voltage divider, and a circuit unit is present which determines the difference between the residual charge voltages picked off after two discharge operations.

DETAILED DESCRIPTION

Figure 1:
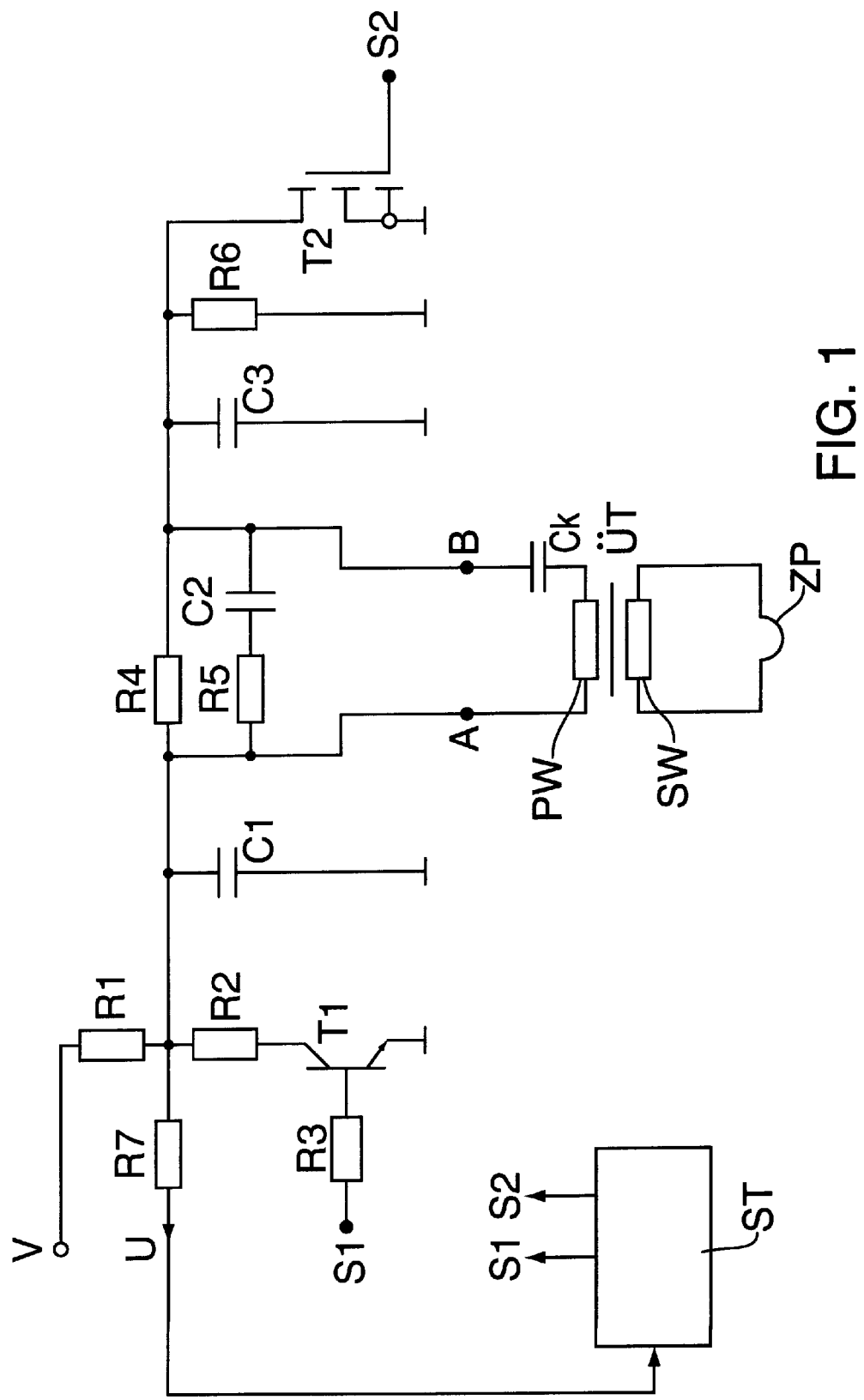
FIG. 1 shows a circuit diagram for measuring the resistance of a load connected on the secondary side to a rotary transformer according to the present invention.

FIG. 1 depicts a transformer ÜT whose primary winding PW and secondary winding SW are rotatable with respect to one another about a common axis. A load, for example the firing pellet ZP for an airbag or a belt tensioner, is connected to secondary winding SW. A capacitor Ck is connected in series with primary winding PW. Connected to terminals A and B of primary winding PW of rotary transformer ÜT is a circuit with which the resistance of firing pellet ZP can be measured. Capacitors C1 and C3 serve to damp high-frequency interference. Resistor R5, connected parallel to terminals A and B, and capacitor C2 form an attenuator in order to suppress transients during the diagnosis of firing pellet ZP, and thus to minimize high-frequency emissions. Capacitor Ck can be charged through a voltage V via a voltage divider R1, R4, and R6. Two electronic switches T1 and T2, preferably transistors, are also present. Terminal B can be grounded via electronic switch T2 by means of a control signal S2. When electronic switch T1 is triggered by a control signal S1 through resistor R3 while terminal B is grounded, capacitor Ck discharges through rotary transformer ÜT and resistor R2. During the charging operation, a voltage U proportional to the charging voltage of capacitor Ck can be picked off at voltage divider R7, R1, R4, R6. After the discharge operation, the voltage U proportional to the residual charge voltage at capacitor Ck can be picked off via voltage divider R7. In a circuit unit ST, the resistance of firing pellet ZP, as well as other diagnostic values concerning the ignition circuit connected to terminals A and B, can be deduced from voltage U.

Figure 2:
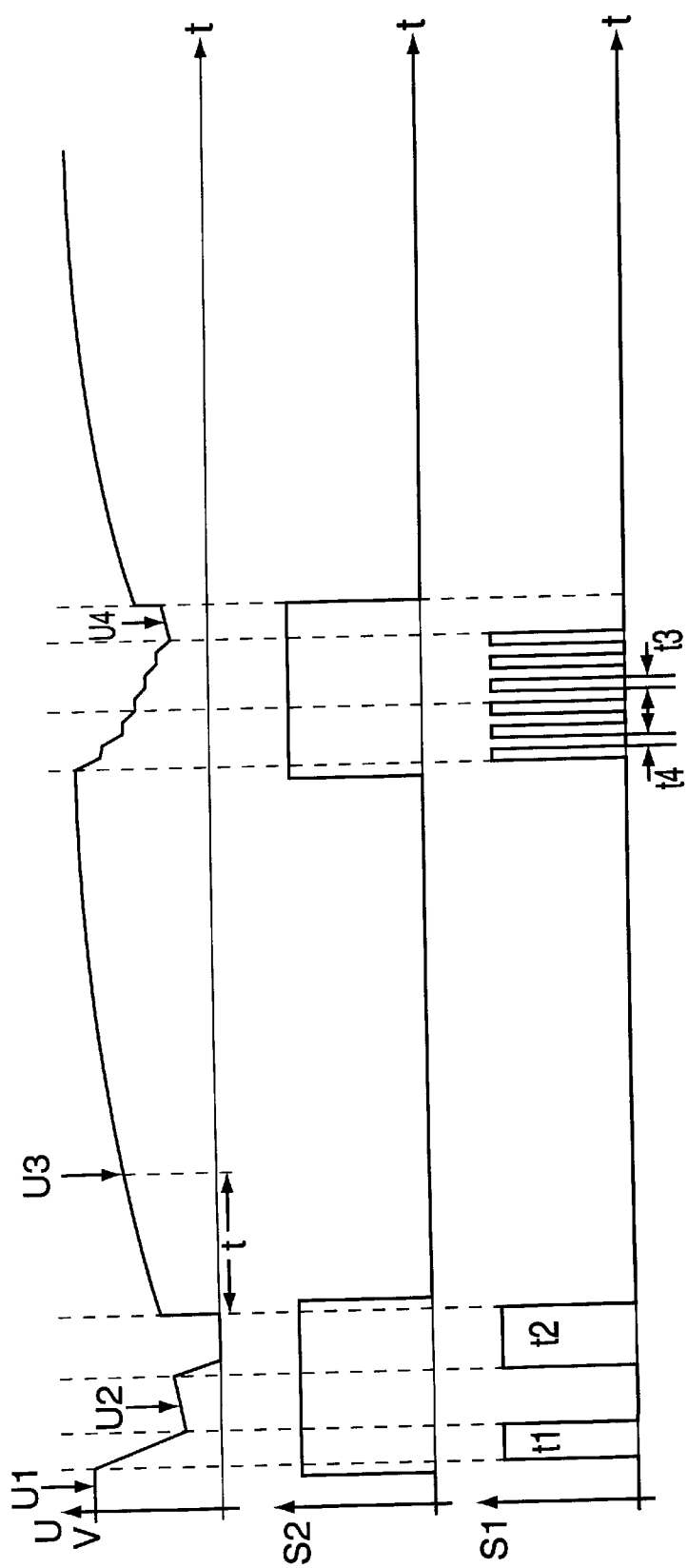
FIG. 2 shows a timing diagram of several signals occurring in the circuit depicted in FIG. 1.
Figure 3:
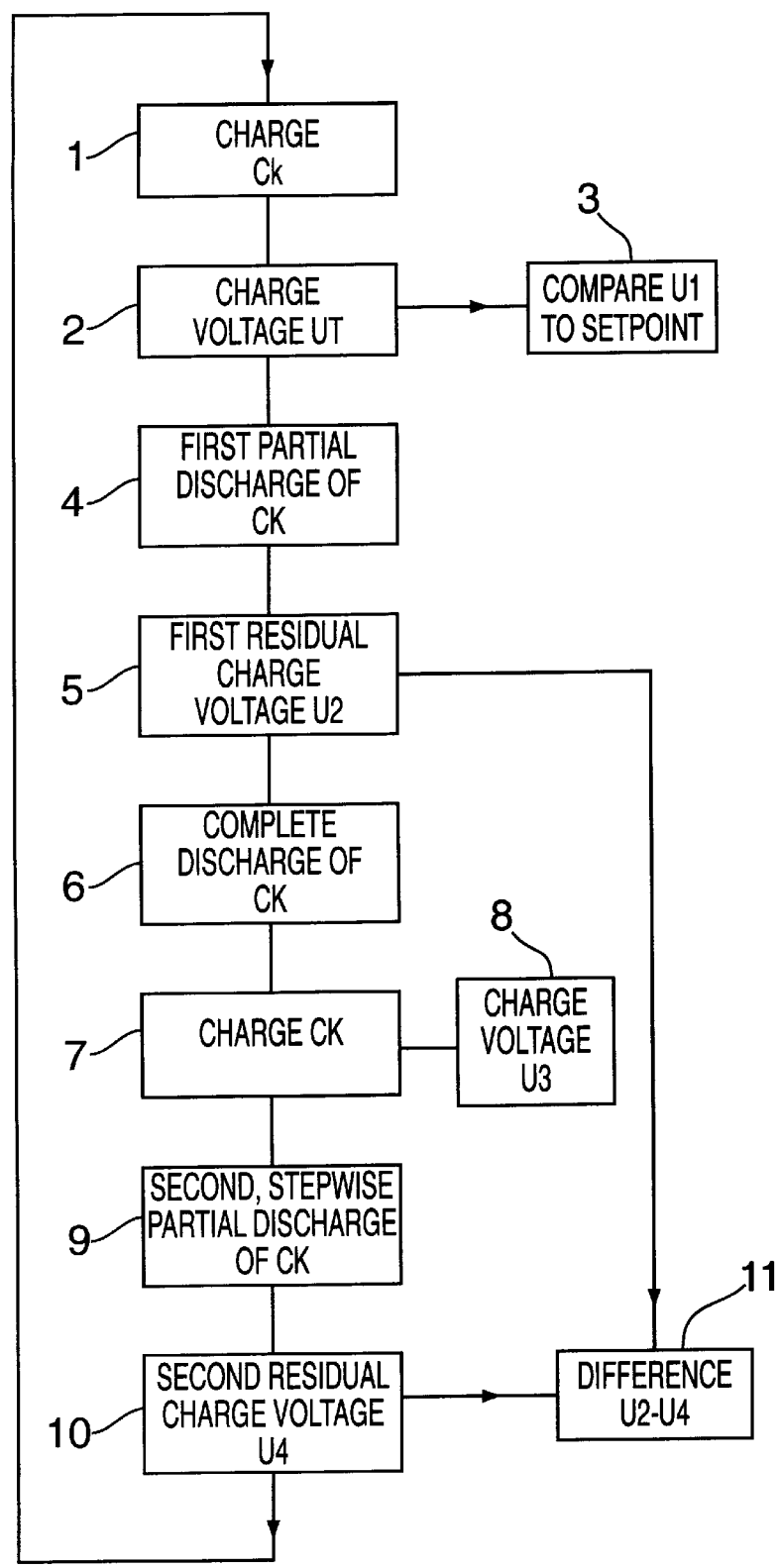
FIG. 3 shows a flow chart representing the steps for achieving the resistance measurement according to the present invention.

The operation of the diagnostic circuit shown in FIG. 1 will be described with reference to the flow chart depicted in FIG. 3 and the time diagram for the control signals S1, S2 and voltage U depicted in FIG. 2. In a first step 1, under the control of circuit unit ST, the voltage V is applied via voltage divider R1, R4, R6 and transformer ÜT to capacitor Ck, in order to charge the latter completely. At the end of the charging operation, as is evident from FIG. 2, the voltage U has reached the value U1. In step 2, this charge voltage U1 is measured and conveyed to circuit unit ST. On the basis of the measured charge voltage U1, a determination can be made in circuit unit ST as to whether terminal A or B is short-circuited with respect to the battery voltage or ground, or whether a shunt exists between terminals A and B, or whether an insulation fault exists in capacitor Ck. This is done, in step 3, by comparing the charge voltage U1 to a setpoint. If the measured voltage U1 deviates by a certain amount from the setpoint, it can then be assumed that one of the aforesaid faults is present.

In step 4, a first partial charging of capacitor Ck is performed. This is done by closing electronic switch T2 by applying the control signal S2, which causes terminal B to be grounded. A few microseconds later, the control signal S1 is applied for a time t1 (approx. 25 microseconds) to electronic switch T1 in order to close it. As a result, capacitor Ck is partially charged via resistor R2 and transformer ÜT. When switch T1 is opened again after time t1, then in step 5 the residual voltage U=U2 still present at capacitor Ck is measured and is retained in circuit unit ST. After switch t1 is opened, a brief settling time must be allowed before the residual charge voltage U2 can be measured. The extent to which capacitor Ck has discharged, and thus the magnitude of the measured residual charge voltage U2, depend on the discharge time t1, resistor R2, ohmic load ZP at secondary winding SW of transformer ÜT, and the magnetic coupling between primary winding PW and secondary winding SW. The triggering time t1 of switch t1 must be selected so that the discharge of capacitor Ck is influenced within the widest possible limits by the change in resistance of firing pellet ZP. The greater the resistance of firing pellet ZP and the greater the spacing between primary winding PW and secondary winding SW, the higher the measured voltage U2. A clear distinction between the influence of firing pellet ZP and the influence of the spacing between windings PW and SW is not yet possible with this measurement.

In step 6, capacitor Ck is completely discharged by the fact that the control signal S1 closes switch T1 for a period t2 (approx. 50 microseconds). After switch T1 has opened again, the control signal S2 is also removed, so that switch T2 also opens. The result of this is that a new charging operation of capacitor Ck begins (step 7). In step 8, the charge voltage U=U3 is measured after a predefined charging time τ. This charging voltage U3 is an indication of the capacitance of capacitor Ck. It is possible thereby to diagnose whether capacitor Ck in the primary circuit of rotary transformer ÜT is defective.

Voltage divider R1, R4, R6 must be selected so that the charging of capacitor Ck in step 7 lies in the range of a few milliseconds, so that in step 9, a second partial discharge of capacitor Ck can be performed with the least possible delay after the first partial discharge.

As was already the case with the first partial discharge, in the case of the second partial discharge the control signal S2 is again applied to electronic switch T2 in order to close the latter, so that terminal B of transformer ÜT is grounded. A few microseconds later, the control signal S1 is applied to electronic switch T1. The control signal S1 is now a pulse train (e.g. six pulses), in which the pulse duration is, for example, 6 microseconds and the interpulse period is also 6 microseconds. The pulse train frequency corresponds approximately to the resonant frequency of the resonant circuit, which corresponds substantially to the inductivity of transformer ÜT and the capacitance of capacitor Ck. The pulsed triggering of switch t1 results in a stepwise discharge of capacitor Ck. After the last pulse of control voltage S1, in step 10 the second residual charge voltage U=U4 present at capacitor Ck is measured, and is retained in circuit unit ST. The magnitude of the discharge of capacitor Ck, and thus the measured voltage U4, depend on resistor R2, the number of discharge pulses, and their pulse duration t3 and interpulse period t4, and on the ohmic load ZP at secondary winding SW of transformer ÜT and the magnetic coupling between primary winding PW and secondary winding SW. The discharge pulse rate must be selected so that the discharge of capacitor Ck is influenced within the widest possible limits by the change in the resistance of firing pellet ZP. The greater the resistance of firing pellet ZP, the lower the residual charge voltage U4 at capacitor Ck; and the greater the distance (i.e. the less the coupling) between primary winding PW and secondary winding SW of transformer ÜT, the higher the voltage U4.

Lastly, in step 11 the voltage difference UD between the two residual charge voltages U2 and U4 after the first and second partial discharges of capacitor Ck is calculated. As shown by equations (1) and (2) for the two residual charge voltages U2 and U4, the resistance of firing pellet ZP contributes to the two residual charge voltages with different signs, so that when the two residual charge voltages U2 and U4 are subtracted, the influences of the firing pellet resistance ZP are added together. Since, however, the residual charge voltages U2 and U4 depend in the same fashion on the spacing, i.e. the coupling, between the primary winding and secondary winding of the transformer, and on any temperature influences, these interference effects compensate for one another when the two residual charge voltages U2 and U4 are subtracted. The result is therefore a voltage difference UD=U2−U4 which provides an indication of the firing pellet resistance ZP that is largely unaffected by fluctuations in the magnetic coupling of transformer ÜT, or by temperature influences.

What is claimed is:

1. A method for measuring a resistance of a load coupled to a secondary side of a rotary transformer by analyzing an electrical variable that is sensed on a primary side of the rotary transformer, the method comprising the steps of:

charging a capacitor inserted into a primary circuit of the rotary transformer;

performing a first discharge operation including the step of partially discharging the capacitor for a predefined time period through the rotary transformer;

determining a first residual charge voltage of the capacitor;

re-charging the capacitor;

performing a second discharge operation including the step of partially discharging the capacitor through the rotary transformer in accordance with a pulse train signal in order to provide a stepwise discharge of the capacitor;

determining a second residual charge voltage of the capacitor; and obtaining a difference between the first residual charge voltage and the second residual charge voltage after the first and second discharge operations are performed, wherein the difference between the first residual charge voltage and the second residual charge voltage is an indication of the resistance of the load.

2. The method according to claim 1, wherein the load includes a firing pellet of an airbag.

3. The method according to claim 1, wherein after the step of charging the capacitor, the method further comprises the steps of:

comparing a current charge voltage of the capacitor to a setpoint;

determining a deviation between the current charge voltage of the capacitor and the setpoint, the deviation indicating one of a short-circuit at terminals located on the primary side of the rotary transformer and an insulation fault in the capacitor.

4. The method according to claim 1, wherein a charge voltage of the capacitor reached after a predefined charging time of the capacitor is an indication of a capacitance of the capacitor.

5. The method according to claim 1, wherein an inductivity of the rotary transformer and a capacitance of the capacitor correspond to a resonant circuit, and wherein a frequency of the pulse train signal corresponds approximately to a resonant frequency of the resonant circuit.

6. An arrangement for measuring a resistance of a load coupled to a secondary side of a rotary transformer by analyzing an electrical variable that is sensed on a primary side of the rotary transformer, comprising:

a plurality of terminals coupled to a primary winding of the rotary transformer;

a capacitor coupled to the plurality of terminals;

a charging circuit;

a first electronic switch for providing a switchable coupling between the capacitor and the charging circuit;

a discharging circuit;

a second electronic switch for providing a switchable coupling between the capacitor and the discharging circuit;

a voltage divider for picking-up a voltage proportional to a voltage of the capacitor from the charging circuit and the discharging circuit; and a circuit unit coupled to the voltage divider and determining a difference between a first residual charge voltage of the capacitor picked-up after a first discharge operation and a second residual charge voltage of the capacitor picked-up after a second, stepwise discharge operation.

* * * * *